(12) United States Patent
Jeng et al.

(10) Patent No.: US 7,205,588 B2
(45) Date of Patent: Apr. 17, 2007

(54) METAL FUSE FOR SEMICONDUCTOR DEVICES

(75) Inventors: Shin-Puu Jeng, Hsinchu (TW); Chi-Hsi Wu, Hsinchu (TW); Shang Y. Hou, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 148 days.

(21) Appl. No.: 10/856,065

(22) Filed: May 28, 2004

(65) Prior Publication Data

US 2004/0219720 A1   Nov. 4, 2004

Related U.S. Application Data

(63) Continuation of application No. 10/245,433, filed on Sep. 17, 2006, now Pat. No. 6,753,210.

(51) Int. Cl.
*H01L 27/10* (2006.01)

(52) U.S. Cl. .................... 257/209; 257/173; 257/751; 257/499; 257/E21.149; 438/642; 438/687

(58) Field of Classification Search ............. 257/50, 257/209, 529, 530, 438, 107, 173, 499, 528; 438/381, 190, 210, 329
See application file for complete search history.

(56) References Cited

U.S. PATENT DOCUMENTS 4,792,835 A   12/1988   Sacarisen et al.
5,936,296 A   8/1999   Park et al.
5,963,825 A * 10/1999   Lee et al. .................... 438/601
6,037,648 A   3/2000   Arndt et al.
6,100,116 A   8/2000   Lee et al.
6,100,118 A   8/2000   Shih et al.
6,261,873 B1 * 7/2001   Bouldin et al. .............. 438/132
2001/0042897 A1 * 11/2001   Yeh et al. .................... 257/529

FOREIGN PATENT DOCUMENTS

JP        08-255837      * 3/1995

* cited by examiner

*Primary Examiner*—Hsien-Ming Lee
*Assistant Examiner*—Su C. Kim
(74) *Attorney, Agent, or Firm*—Thomas, Kayden, Horstemeyer & Risley

(57) ABSTRACT

A method of forming a metal fuse comprising the following steps. A structure is provided having exposed adjacent metal structures. A patterned dielectric layer is formed over the structure. The patterned dielectric layer having via openings 2 exposing at least a portion of the exposed adjacent metal structures. A metal fuse portion is formed between at least two of the adjacent metal structures without additional photolithography, etch or deposition processes. The metal fuse portion including a portion having a nominal mass and a sub-portion of the portion having a mass less than the nominal mass so that the metal fuse portion is more easily disconnected at the less massive sub-portion during programming of the metal fuse portion.

18 Claims, 5 Drawing Sheets

METAL FUSE FOR SEMICONDUCTOR DEVICES

CROSS-REFERENCE TO RELATED APPLICATIONS

This application is a continuation of application Ser. No. 10/245,433, filed on Sep. 17, 2002, now U.S. Pat. No. 6,753,210.

FIELD OF THE INVENTION

The present invention relates generally to semiconductor fabrication and more specifically to semiconductor device fuse fabrication.

BACKGROUND OF THE INVENTION

The thickness of the top aluminum (Al) layer on fuses tend to be thick, i.e. about 12,000 Å, because of the mechanical strength requirements for probing and bonding. If the fuse is formed with thick a top Al layer, the yield of the fuse operation, e.g. blowing open by a laser beam, tends to be low.

U.S. Pat. No. 6,261,873 B1 to Bouldin et al. describes a metal fuse with thick and thin segments.

U.S. Pat. No. 6,100,118 to Shih et al. describes a fuse guard ring method and structure.

U.S. Pat. No. 6,100,116 to Lee et al. describes a method to form a protected metal fuse by forming protection layers completely around the fuse.

U.S. Pat. No. 4,792,835 to Sacarisen et al. describes a process for making a metal fuse link in a MOS or CMOS process.

U.S. Pat. No. 6,037,648 to Arndt et al. describes a semiconductor structure including a conductive fuse and a process of fabricating the same.

U.S. Pat. No. 5,936,296 to Park et al. describes integrated circuits having metallic fuse links.

SUMMARY OF THE INVENTION

Accordingly, it is an object of one or more embodiments of the present invention to provide improved methods of forming metal fuses.

Other objects will appear hereinafter.

It has now been discovered that the above and other objects of the present invention may be accomplished in the following manner. Specifically, a structure is provided having exposed adjacent metal structures. A patterned dielectric layer is formed over the structure. The patterned dielectric layer having via openings exposing at least a portion of the exposed adjacent metal structures. A metal fuse portion is formed between at least two of the adjacent metal structures without additional photolithography, etch or deposition processes. The metal fuse portion including a portion having a nominal mass and a sub-portion of the portion having a mass less than the nominal mass so that the metal fuse portion is more easily disconnected at the less massive sub-portion during programming of the metal fuse portion.

BRIEF DESCRIPTION OF THE DRAWINGS

The present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENT

First Embodiment—Fuse Trench 32

Initial Structure

Figure 1:
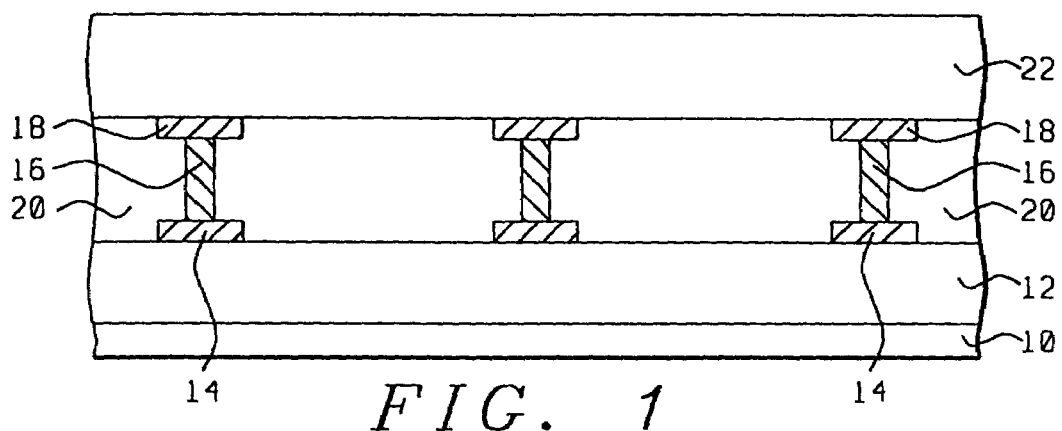
FIGS. 1 to 3 schematically illustrates a first preferred embodiment of the present invention.

As shown in FIG. 1 and in the first embodiment of the present invention, structure 10 has an overlying first dielectric layer 12 formed thereover.

Structure 10 is preferably understood to possibly include a semiconductor wafer or substrate, active and passive devices formed within the wafer, conductive layers and dielectric layers (e.g., inter-poly oxide (IPO), intermetal dielectric (IMD), etc.) formed over the wafer surface. The term "semiconductor structure" is meant to include devices formed within a semiconductor wafer and the layers overlying the wafer.

First dielectric layer 12 may include metal devices (not shown) that are electrically connected to IMD lower metal trench M1 structures 14 formed within intermetal dielectric (IMD) layer 20 overlying first dielectric layer 12. IMD metal via structures 16 contact IMD lower metal trench M1 structures 14 with IMD upper metal trench M2 structures 18 contacting IMD metal via structures 16 as shown in FIG. 1.

IMD metal structures 14, 16, 18 are preferably formed of copper, aluminum, gold, titanium, silver or tungsten and are more preferably formed of copper.

A second dielectric layer 22 is formed over IMD layer 20 to a thickness of from about 3000 to 20,000 Å and more preferably from about 5000 to 10,000 Å.

First dielectric layer 12, IMD layer 20 and second dielectric layer 22 are preferably formed of undoped $SiO_2$ (USG), fluorinated $SiO_2$ (FSG) or low-k dielectric material and more preferably undoped $SiO_2$ (USG).

Formation of Vias 24, 26, 28 and Fuse Trench 32

Figure 2:
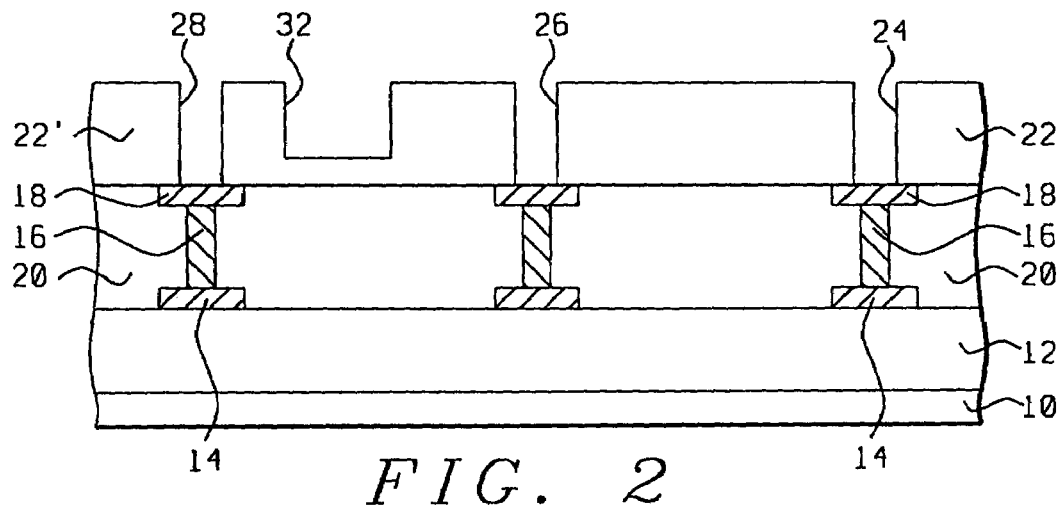

As shown in FIG. 2, second dielectric layer 22 is patterned to form vias 24, 26, 28 exposing at least a portion of IMD upper metal trench M2 structures 18. Simultaneously with the formation of vias 24, 26, 28, fuse trench 32 is also formed within patterned second dielectric layer 22' between two adjacent IMD upper metal trench M2 structures 18 as shown in FIG. 2 which is to be selectively fused.

Formation of Patterned Fuse 35 and Patterned Metal Structure 34

Figure 3:
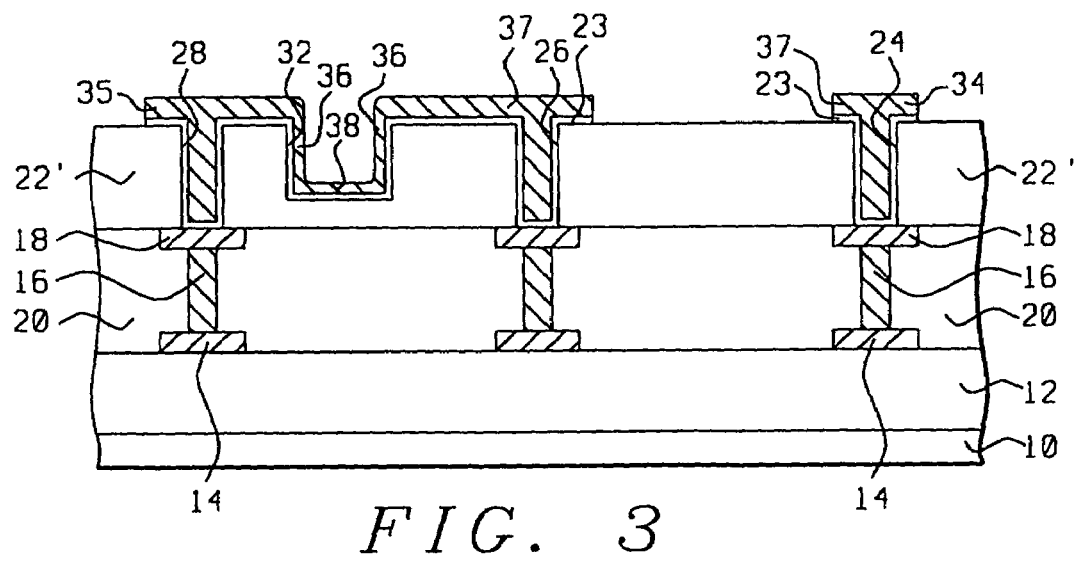

As shown in FIG. 3, a barrier layer 23 is formed over the patterned second dielectric layer 22' as necessary (for example if upper metal trench M2 structures 18 are formed of copper and the second patterned metal layers 34, 35 are formed of aluminum). Barrier layer 23 is preferably from about 50 to 1000 Å thick and more preferably from about 100 to 500 Å thick. Barrier layer 23 is preferably comprised of TaN, TiN, TaSiN or WN and is more preferably comprised of TaN.

A second metal layer 37 is then formed over barrier layer 23 by sputter depositing so that the sputter metal 37 formed over the side walls of the fuse trench 32 at 36 is thinner than the sputter metal 37 formed over the horizontal portions of barrier layer 23 such as at the bottom of the fuse trench 32 at 38.

Second metal layer 37 is preferably comprised of aluminum, copper, gold, titanium, silver or tungsten and is more preferably formed of aluminum.

The second metal layer 37 and barrier layer 23 are then patterned to form a fuse 35 with a corresponding underlying patterned barrier layer 23 and a patterned third metal structure 34 with a corresponding underlying patterned barrier layer 23. Patterned third metal structure 34 may comprise, for example a metal via portion and a metal line as shown in FIG. 3.

Since the second metal layer 36 on the side walls of the fuse trench 32 has a lower step coverage, the side wall second metal layer portions 36 become the weak link of the fuse 35 and can be more easily blown by a laser directed at the side wall second metal layer portions 36 as the volume of metal that needs to be vaporized by the laser beam is reduced. The side wall second metal layer portions 36 having a thickness of preferably from about 500 to 10,000 Å and more preferably from about 1000 to 4000 Å.

The formation of the weak link portion of the fuse 35, i.e. the side wall second metal layer portions 36 don't require any additional photolithography, etch or deposition processes. Depending upon the actual needs, the number of weak link portions may be more than one.

Second Embodiment—Fuse Trench 132 Only

Initial Structure

Figure 4:
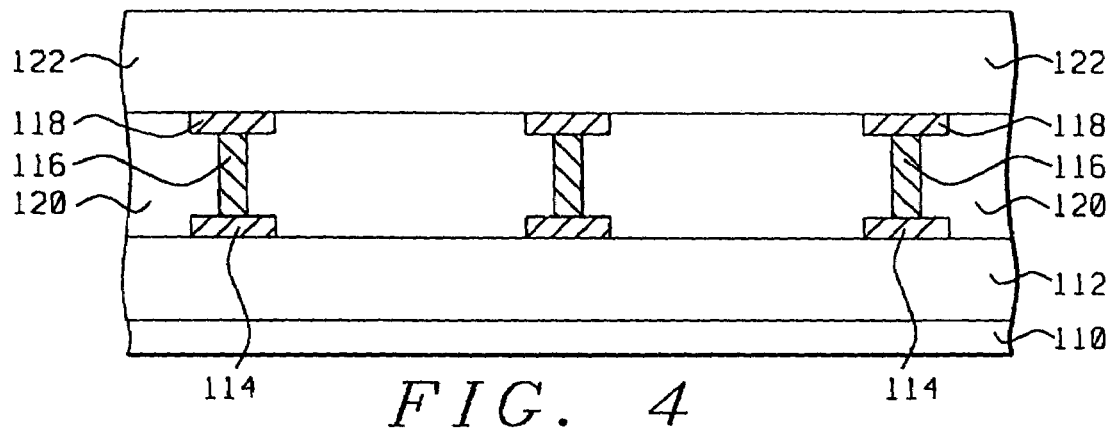
FIGS. 4 to 6 schematically illustrates a second preferred embodiment of the present invention.

As shown in FIG. 4 and in the second embodiment of the present invention, structure 110 has an overlying first dielectric layer 112 formed thereover.

Structure 110 is preferably a silicon substrate and is understood to possibly include a semiconductor wafer or substrate, active and passive devices formed within the wafer, conductive layers and dielectric layers (e.g., interpoly oxide (IPO), intermetal dielectric (IMD), etc.) formed over the wafer surface. The term "semiconductor structure" is meant to include devices formed within a semiconductor wafer and the layers overlying the wafer.

First dielectric layer 112 may include metal devices (not shown) that are electrically connected to IMD lower metal trench structures 114 formed within intermetal dielectric (IMD) layer 120 overlying first dielectric layer 112. IMD metal via structures 116 contact IMD lower metal trench structures 114 with IMD upper metal trench structures 118 contacting IMD metal via structures 116 as shown in FIG. 4.

IMD metal structures 114, 116, 118 are preferably formed of copper, aluminum, gold, titanium, silver or tungsten and are more preferably formed of copper.

A second dielectric layer 122 is formed over IMD layer 120 to a thickness of from about 3000 to 20,000 Å and more preferably from about 5000 to 10,000 Å.

First dielectric layer 112, IMD layer 120 and second dielectric layer 122 are preferably formed of undoped $SiO_2$ (USG), fluorinated $SiO_2$ (FSG) or low-k dielectric material and more preferably undoped $SiO_2$ (USG).

Formation of Via 124 and Fuse Trench 132

Figure 5:
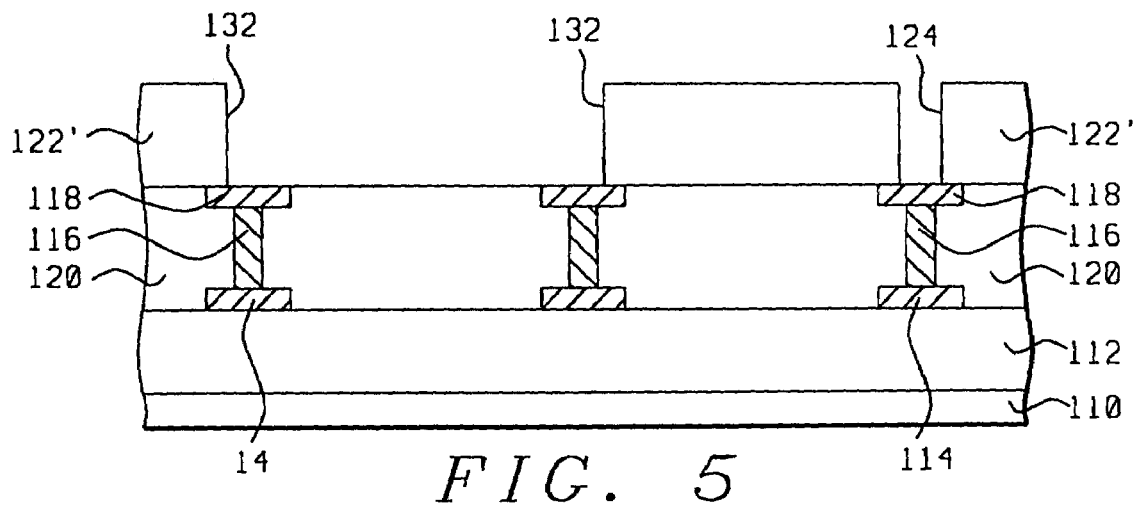

As shown in FIG. 5, second dielectric layer 122 is patterned to form via 124 exposing at least a portion of one IMD upper metal trench structure 118. Simultaneously with the formation of via 124, fuse trench 132 is also formed within patterned second dielectric layer 122' between two adjacent IMD upper metal trench structures 118 as shown in FIG. 5 which are to be selectively fused. Unlike in the conventional aluminum (Al) top fuse structure, there is no via required for the fuse to connect to the metal 118 at the next lower level. The fuse trench 132 is formed to expose the underlying adjacent metal structures 118 in the fuse area.

Formation of Patterned Fuse 135 and Patterned Third Metal Structure 134.

Figure 6:
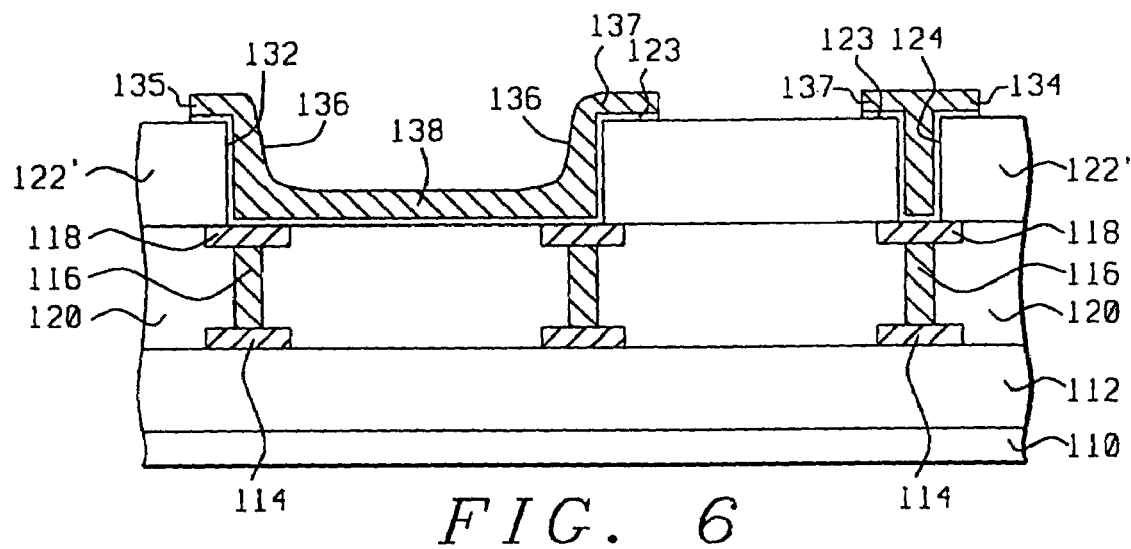

As shown in FIG. 6, a barrier layer 123 is formed over the patterned second dielectric layer 22' as necessary (for example if upper metal trench structures 118 are formed of copper and the second patterned third metal layers 134, 137 are formed of aluminum). Barrier layer 123 is preferably from about 50 to 1000 .ANG. thick and more preferably from about 100 to 500 .ANG. thick. Barrier layer 123 is preferably comprised of TaN, TiN, TaSiN or WN and is more preferably comprised of TaN.

A second metal layer 137 is then formed over barrier layer 123 by sputter depositing so that the sputter metal 137 formed over the side walls of the fuse trench 132 at 136 is thinner than the sputter metal 137 formed over the horizontal portions of barrier layer 123 such as at the bottom of the fuse trench 132 at 138. Second metal layer 137 is in direct contact with the underlying adjacent metal structures 118 at the next lower level. This greatly simplifies the fuse structure 135 since there are no vias.

Second metal layer 137 is preferably comprised of aluminum, copper, gold, titanium, silver or tungsten and is more preferably formed of aluminum.

The second metal layer 137 and barrier layer 123 are then patterned to form a fuse 135 with a corresponding underlying patterned barrier layer 123 and a patterned third metal structure 134 with a corresponding underlying patterned barrier layer 123. Patterned third metal structure 134 may comprise, for example a metal via portion and a metal line as shown in FIG. 6.

Since the second metal layer 137 on the side walls of the fuse trench 132 as at 136 has a lower step coverage, the side wall second metal layer portions 136 become the weak link of the fuse 135 and can be more easily blown by a laser directed at the side wall second metal layer portions 136 as the volume of metal that needs to be vaporized by the laser beam is reduced. The side wall second metal layer portions 136 having a thickness of preferably from about 500 to 10,000 Å and more preferably from about 1000 to 4000 Å.

The formation of the weak link portion of the fuse 135, i.e. the side wall second metal layer portions 136, don't require any additional photolithography, etch or deposition processes.

Third Embodiment—Dual Fuse Trenches 232, 240

Initial Structure

Figure 7:
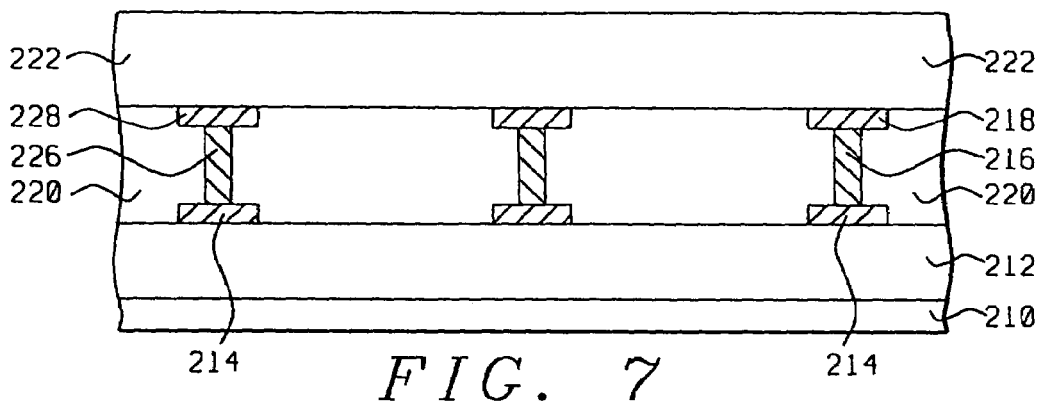
FIGS. 7 to 9 schematically illustrates a third preferred embodiment of the present invention.

As shown in FIG. 7 and in the third embodiment of the present invention, structure 210 has an overlying first dielectric layer 212 formed thereover.

Structure 210 is preferably a silicon substrate and is understood to possibly include a semiconductor wafer or substrate, active and passive devices formed within the wafer, conductive layers and dielectric layers (e.g., interpoly oxide (IPO), intermetal dielectric (IMD), etc.) formed over the wafer surface. The term "semiconductor structure" is meant to include devices formed within a semiconductor wafer and the layers overlying the wafer.

First dielectric layer 212 may include metal devices (not shown) that are electrically connected to IMD lower metal trench structures 214 formed within intermetal dielectric (IMD) layer 220 overlying first dielectric layer 212. IMD metal via structures 216 contact IMD lower metal trench structures 214 with IMD upper metal trench structures 218 contacting IMD metal via structures 216 as shown in FIG. 7.

IMD metal structures 214, 216, 218 are preferably formed of copper, aluminum, gold, titanium, silver or tungsten and are more preferably formed of copper.

A second dielectric layer 222 is formed over IMD layer 220 to a thickness of from about 3000 to 20,000 Å and more preferably from about 5000 to 10,000 Å.

First dielectric layer 212, IMD layer 220 and second dielectric layer 222 are preferably formed of undoped $SiO_2$ (USG), fluorinated $SiO_2$ (FSG) or low-k dielectric material and more preferably undoped $SiO_2$ (USG).

Formation of Vias 224, 226, 228 and Dual Fuse Trench 232, 240

Figure 8:
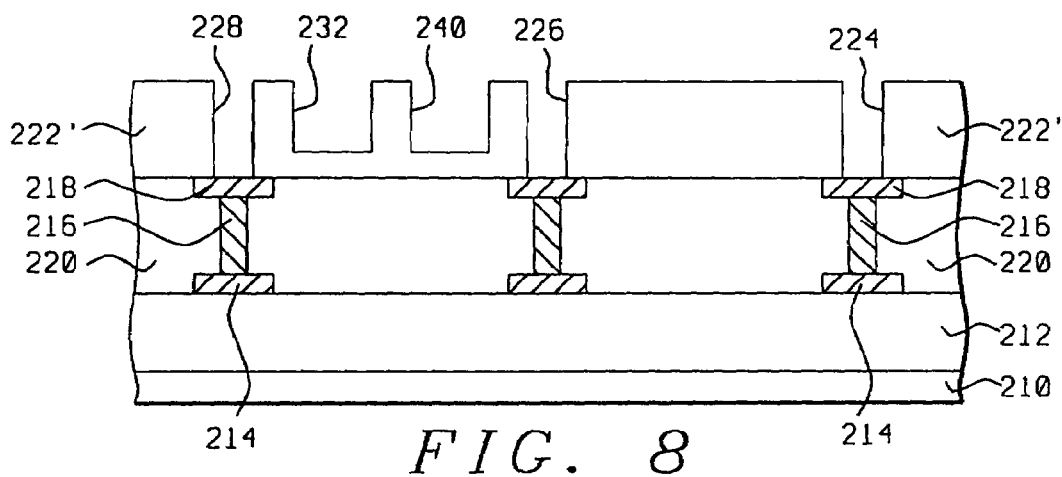

As shown in FIG. 8, second dielectric layer 222 is patterned to form vias 224, 226, 228 exposing at least a portion of IMD upper metal trench structures 218. Simultaneously with the formation of vias 224, 226, 228, dual fuse trenches 232, 240 are also formed within patterned second dielectric layer 292' between two adjacent IMD upper metal trench structures 218 as shown in FIG. 8 which are to be selectively fused.

Formation of Patterned Fuse 235 and Patterned Third Metal Structure 234

Figure 9:
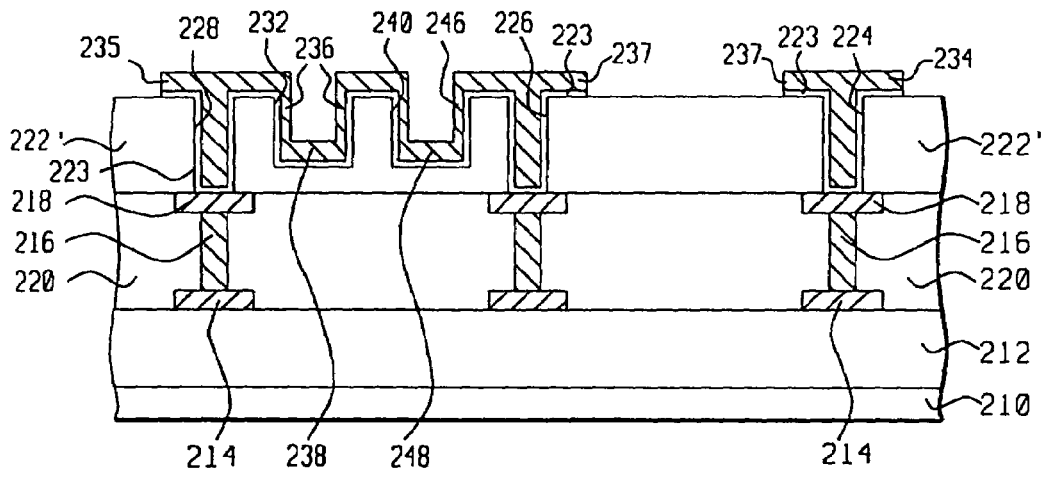

As shown in FIG. 9, a barrier layer 223 is formed over the patterned second dielectric layer 222' as necessary (for example if upper metal trench structures 218 are formed of copper and the second patterned metal layers 234, 237 are formed of aluminum). Barrier layer 223 is preferably from about 50 to 1000 .ANG. thick and more preferably from about 100 to 500 .ANG. thick. Barrier layer 223 is preferably comprised of TaN, TiN, TaSiN or WN and is more preferably comprised of TaN.

A second metal layer 237 is then formed over barrier layer 223 by sputter depositing so that the sputter metal 237 formed over the side walls of the respective fuse trench 232, 240 at 236, 246 is thinner than the sputter metal 237 formed over the horizontal portions of barrier layer 223 such as at the bottom of the respective fuse trench 232, 240 at 238, 248.

Second metal layer 237 is preferably comprised of aluminum, copper, gold, titanium, silver or tungsten and is more preferably formed of aluminum.

The second metal layer 237 and barrier layer 223 are then patterned to form a fuse 235 with a corresponding underlying patterned barrier layer 223 and a patterned third metal structure 234 with a corresponding underlying patterned barrier layer 223. Patterned third metal structure 234 may comprise, for example a metal via portion and a metal line as shown in FIG. 9.

Since the second metal layer 236 on the side walls of the respective fuse trenches 232, 240 has a lower step coverage, the side wall second metal layer portions 236, 246 become the weak link of the fuse 235 and can be more easily blown by a laser directed at the side wall second metal layer portions 236, 246 as the volume of metal that needs to be vaporized by the laser beam is reduced. The side wall second metal layer portions 236 having a thickness of preferably from about 500 to 10,000 Å and more preferably from about 1000 to 4000 Å.

The formation of the weak link portion of the fuse 235, i.e. the side wall second metal layer portions 236, 246 within the respective fuse trenches 232, 240 don't require any additional photolithography, etch or deposition processes. Depending upon the actual needs, the number of weak link portions can be more than one.

Fourth Embodiment—Fuse Neck 364

Initial Structure

Figure 10:
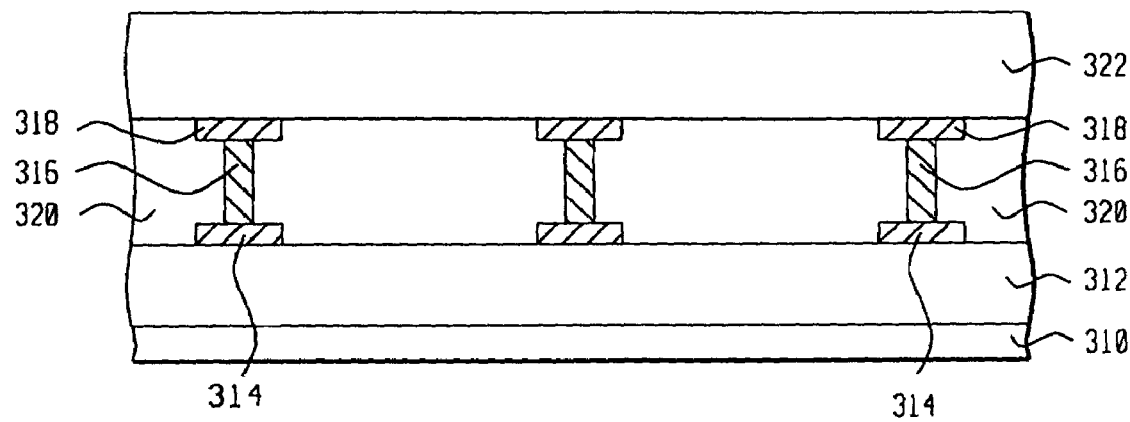
FIGS. 10 to 13 schematically illustrates a fourth preferred embodiment of the present invention, with FIG. 13 a top down view of FIG. 12 taken along line 13—13.

As shown in FIG. 10 and in the fourth embodiment of the present invention, structure 310 has an overlying first dielectric layer 312 formed thereover.

Structure 310 is preferably a silicon substrate and is understood to possibly include a semiconductor wafer or substrate, active and passive devices formed within the wafer, conductive layers and dielectric layers (e.g., interpoly oxide (IPO), intermetal dielectric (IMD), etc.) formed over the wafer surface. The term "semiconductor structure" is meant to include devices formed within a semiconductor wafer and the layers overlying the wafer.

First dielectric layer 312 may include metal devices (not shown) that are electrically connected to IMD lower metal trench structures 314 formed within intermetal dielectric (IMD) layer 320 overlying first dielectric layer 312. IMD metal via structures 316 contact IMD lower metal trench structures 314 with IMD upper metal trench structures 318 contacting IMD metal via structures 316 as shown in FIG. 10.

IMD metal structures 314, 316, 318 are preferably formed of copper, aluminum, gold, titanium, silver or tungsten and are more preferably formed of copper.

A second dielectric layer 322 is formed over IMD layer 320 to a thickness of from about 3000 to 20,000 Å and more preferably from about 5000 to 10,000 Å.

First dielectric layer 312, IMD layer 320 and second dielectric layer 322 are preferably formed of undoped $SiO_2$ (USG), fluorinated $SiO_2$ (FSG) or low-k dielectric material and more preferably undoped $SiO_2$ (USG).

Formation of Vias 324, 326, 328

Figure 11:
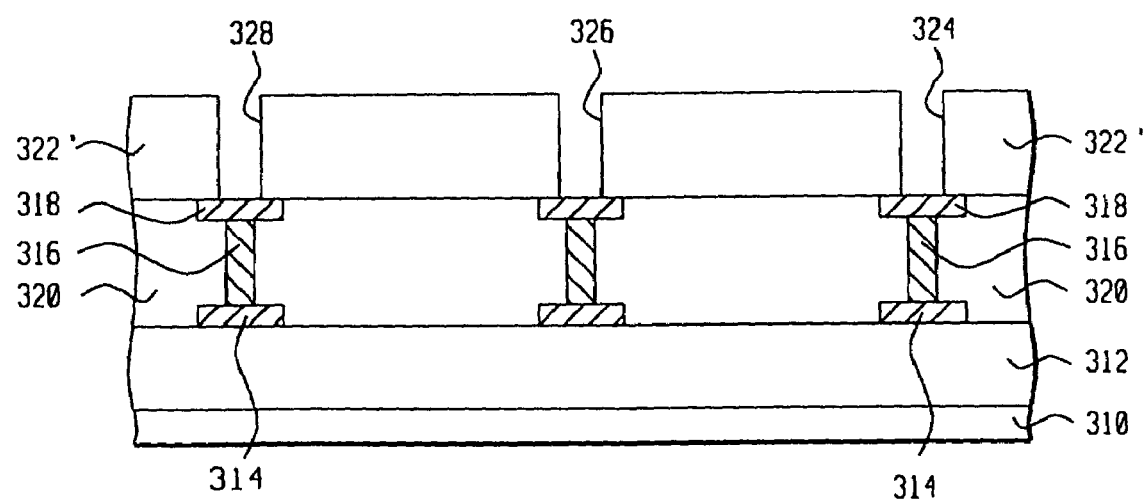

As shown in FIG. 11, second dielectric layer 322 is patterned to form vias 324, 326, 328 exposing at least a portion of IMD upper metal trench structures 318.

Formation of Patterned Fuse 335 and Patterned Third Metal Structure 334

Figure 12:
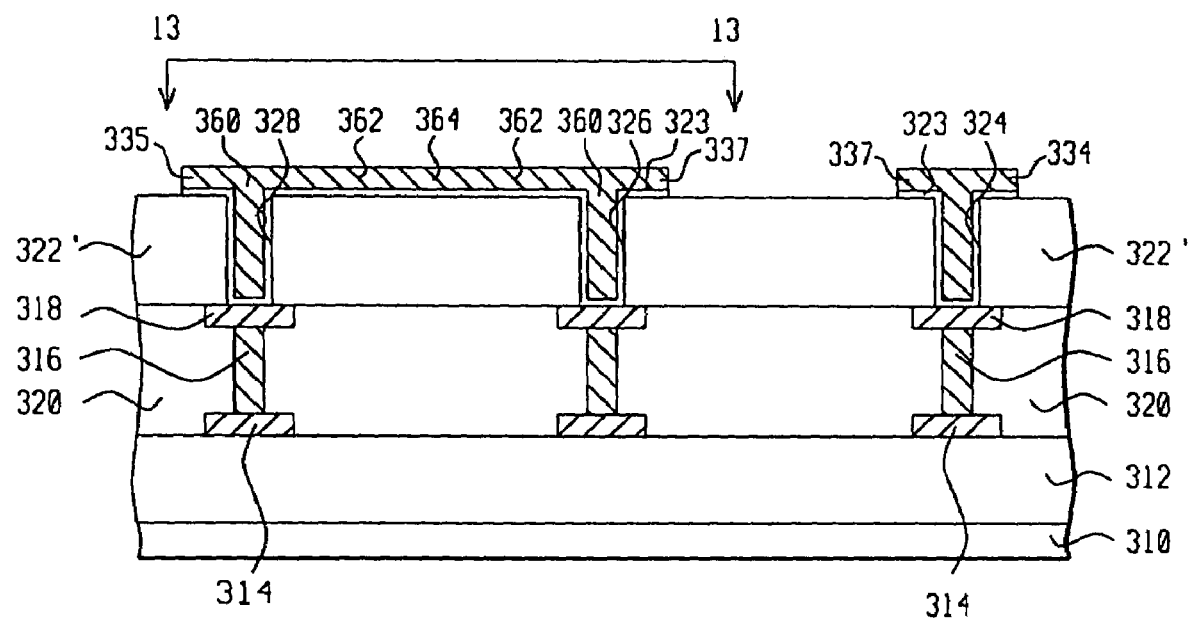

As shown in FIG. 12, a barrier layer 323 is formed over the patterned second dielectric layer 322' as necessary (for example if upper metal trench structures 318 are formed of copper and the second patterned third metal layers 334, 337 are formed of aluminum). Barrier layer 323 is preferably from about 50 to 1000 .ANG. thick and more preferably from about 100 to 500 .ANG. thick. Barrier layer 323 is preferably comprised of TaN, TiN, TaSiN or WN and is more preferably comprised of TaN.

A second metal layer 337 is then formed over barrier layer 323.

Second metal layer 337 is preferably comprised of aluminum, copper, gold, titanium, silver or tungsten and is more preferably formed of aluminum.

The second metal layer 337 and barrier layer 323 are then patterned to form a fuse 335 with a corresponding underlying patterned barrier layer 323 and a patterned third metal structure 334 with a corresponding underlying patterned barrier layer 323. Patterned third metal structure 334 may comprise, for example a metal via portion and a metal line as shown in FIG. 12.

Fuse 335 is formed between two adjacent IMD upper metal trench structures 318 as shown in FIG. 12 which are to be selectively fused.

Figure 13:
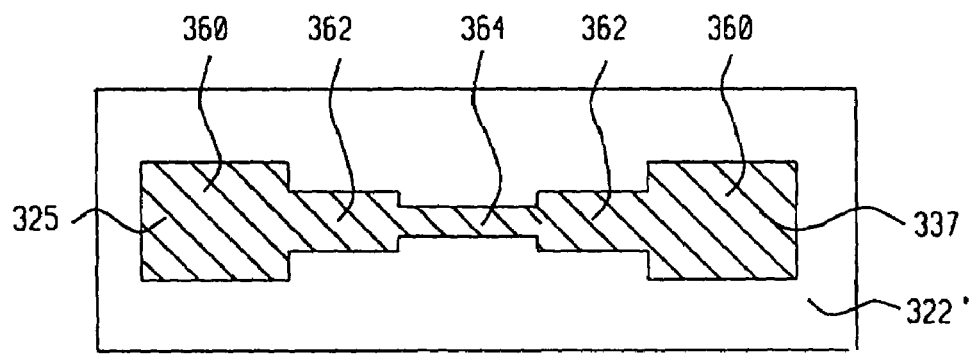

As shown in FIG. 13, a top down view of FIG. 12 at line 13—13, fuse 335 includes a narrowest neck portion 364 between the two adjacent IMD upper metal trench structures 318 (as shown in FIG. 12) which are to be selectively fused. The narrowest neck portion 364 becomes the weak link of the fuse 335 and can be more easily blown by a laser directed at the narrowest neck portion 364 as the volume of metal that needs to be vaporized by the laser beam is reduced. The narrowest neck portion 364 having a width of preferably from about 1000 to 20,000 .ANG. and more preferably from about 2000 to 5000 .ANG.

Thin neck portion 364 may be stepped down from widest portions 360 of fuse 335 by intermediate width portions 362 as shown in FIG. 13.

The formation of the weak link narrowest neck portion 364 of the fuse 335 doesn't require any additional photolithography, etch or deposition processes. Depending upon the actual needs, the number of weak link portions 364 can be more than one.

Although the four embodiments of the present invention indicate lower metal trench structures 14 connected to upper metal trench structures 18 by IMD metal via structures 16, other "M" layers may be used, for example trench structures 14 connected to upper metal trench structures 18 by IMD metal via structures 16.

In each of the four embodiments, the fuse repair rate of thick fuses are enhanced through the formation of weak links in the fuse by locally reducing the volume of the fuse metal so that the heat absorption (total fuse surface area) remains about the same, while the vaporization by local heating in the neck area is enhanced.

Advantages of the Present Invention

The advantages of one or more embodiments of the present invention include:
1. the formation of weak links increases the yield of laser repair;
2. the formation of weak links doesn't require additional photolithography and/or etch process steps;
3. the addition of weak links allows the use of thicker metal; and
4. specifically, the second embodiment simplifies the fuse structure.

While particular embodiments of the present invention have been illustrated and described, it is not intended to limit the invention, except as defined by the following claims.

We claim:

1. A metal fuse structure, comprising:
a structure having adjacent metal structures;
a patterned dielectric layer over the structure;
the patterned dielectric layer having at least one opening exposing at least a portion of each of the adjacent metal structures; and a metal fuse portion between the adjacent metal structures; the metal fuse portion including a portion having a nominal mass and a sub-portion of the portion having a mass less than the nominal mass so that the metal fuse portion is more easily disconnected at the less massive sub-portion during programming of the metal fuse portion, wherein the metal fuse portion includes at least a trench portion; the trench portion having side wall portions that comprise the less massive sub-portion.

2. The structure of claim 1, wherein the structure is a semiconductor wafer or substrate, active and passive devices formed within the wafer or substrate, conductive layers and dielectric layers formed over the surface of the wafer or substrate.

3. The structure of claim 1, wherein the adjacent metal structures are selected from the group consisting of copper, aluminum, gold, titanium, silver and tungsten; the patterned dielectric layer is selected from the group consisting of undoped SiO2 (USG), fluorinated SiO2 (FSG) and low-k dielectric material; and the metal fuse portion is selected from the group consisting of aluminum, copper, gold, titanium, silver and tungsten.

4. The structure of claim 1, wherein the less massive sub-portion has a thickness of from about 500 to 10,000 Å.

5. The structure of claim 1, wherein the less massive sub-portion has a thickness of from about 1000 to 4000 Å.

6. The structure of claim 1, wherein the less massive sub-portion has a width of from about 1000 to 20,000-Å.

7. The structure of claim 1, wherein the less massive sub-portion has a width of from about 2000 to 5000-Å.

8. The structure of claim 1, wherein the metal fuse portion includes dual trench portions; the dual trench portions having respective side wall portions that comprise the less massive sub-portion.

9. The structure of claim 1, wherein the metal fuse portion includes a neck portion that comprises the less massive sub-portion.

10. The structure of claim 1, wherein the metal fuse portion is programmable by the use of a laser beam.

11. A metal fuse structure, comprising:
a structure having adjacent metal structures;
a patterned dielectric layer over the structure;
the patterned dielectric layer having via openings exposing at least a portion of the adjacent metal structures and at least one fuse trench between the adjacent metal structures;
each of the at least one fuse trench having side walls and a bottom; and
a metal fuse portion between the adjacent metal structures and within the at least one fuse trench;
the metal fuse portion including a portion having a nominal mass and a sub-portion of the portion having a mass less than the nominal mass so that the metal fuse portion is more easily disconnected at the less massive sub-portion during programming of the metal fuse portion;
the less massive sub-portion being at least over the respective side walls of the at least one fuse trench, wherein the metal fuse portion includes at least a trench portion; the trench portion having side wall portions that comprise the less massive sub-portion.

12. The structure of claim 11, wherein the structure is a semiconductor wafer or substrate, active and passive devices formed within the wafer or substrate, conductive layers and dielectric layers formed over the surface of the wafer or substrate.

13. The structure of claim 11, wherein the adjacent metal structures are selected from the group consisting of copper, aluminum, gold, titanium, silver and tungsten; the patterned dielectric layer is selected from the group consisting of undoped SiO2 (USG), fluorinated SiO2 (FSG) and low-k dielectric material; and the metal fuse portion is selected from the group consisting of aluminum, copper, gold, titanium, silver and tungsten.

14. The structure of claim 11, wherein the less massive sub-portion has a thickness of from about 500 to 10,000 Å.

15. The structure of claim 11, wherein the less massive sub-portion has a thickness of from about 1000 to 4000 Å.

16. The structure of claim 11, wherein the less massive sub-portion has a width of from about 1000 to 20,000 Å.

17. The structure of claim 11, wherein the less massive sub-portion has a width of from about 2000 to 5000 Å.

18. The structure of claim 11, wherein the metal fuse portion includes dual fuse trench portions; the dual fuse trench portions having respective side wall portions that comprise the less massive sub-portion.

* * * * *